US012648455B2

(12) United States Patent
Ramos et al.

(10) Patent No.: US 12,648,455 B2
(45) Date of Patent: Jun. 2, 2026

(54) CLIP INTERCONNECT WITH MICRO CONTACT HEADS

(71) Applicant: SEMICONDUCTOR COMPONENTS INDUSTRIES, LLC, Phoenix, AZ (US)

(72) Inventors: Emmanuel Silvestre Ramos, Cainta (PH); Ghizelle Jane Estrada Abarro, Sta Rosa (PH); Aaron Alabin Bitavarra, Biñan (PH); Roxanna Samson Caguioa, Baguio City (PH)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 175 days.

(21) Appl. No.: 17/110,413

(22) Filed: Dec. 3, 2020

(65) Prior Publication Data

US 2022/0181290 A1     Jun. 9, 2022

(51) Int. Cl.
*H10W 70/40*          (2026.01)
*H10W 72/00*          (2026.01)
*H10W 72/60*          (2026.01)

(52) U.S. Cl.
CPC ....... *H10W 70/466* (2026.01); *H10W 70/442* (2026.01); *H10W 70/429* (2026.01); *H10W 72/016* (2026.01); *H10W 72/01604* (2026.01); *H10W 72/01661* (2026.01); *H10W 72/073* (2026.01); *H10W 72/076* (2026.01); *H10W 72/07604* (2026.01); *H10W 72/07652* (2026.01); *H10W 72/07653* (2026.01); *H10W 72/07654* (2026.01); *H10W 72/60* (2026.01); *H10W 72/621* (2026.01); *H10W 72/627*

(2026.01); *H10W 72/631* (2026.01); *H10W 72/637* (2026.01); *H10W 72/647* (2026.01); *H10W 72/652* (2026.01); *H10W 72/886* (2026.01)

(58) Field of Classification Search
CPC . H01L 2224/84001; H01L 2224/35001; H01L 2224/84005; H01L 2224/776; H01L 2224/77621; H01L 23/49537; H01L 23/49524; H01L 2224/34–41505; H01L 24/34–41; H10W 72/07602–07607; H10W 72/07621; H10W 72/07627; H10W 72/627; H10W 72/637; H10W 70/442; H10W 70/446
See application file for complete search history.

(56) References Cited

U.S. PATENT DOCUMENTS

| | | | | | |
|---|---|---|---|---|---|
| 3,698,073 | A | * | 10/1972 | Helda | H01L 24/01 228/160 |
| 3,967,366 | A | * | 7/1976 | Birglechner | H01L 24/37 228/160 |

(Continued)

FOREIGN PATENT DOCUMENTS

| | | | |
|---|---|---|---|
| EP | 0204102 | A2 * | 12/1986 |
| WO | 2018127845 | A1 | 11/2015 |
| WO | 2015175913 | A1 | 7/2018 |

*Primary Examiner* — Lauren R Bell
(74) *Attorney, Agent, or Firm* — Brake Hughes Bellermann LLP

(57) ABSTRACT

A furcated clip includes a removable collar, and an arrangement of stems attached to the removable collar. The stems are configured for contacting bond pads of a semiconductor die and connecting the bond pads to leadframe posts of a leadframe structure.

18 Claims, 9 Drawing Sheets

(56)                    References Cited

U.S. PATENT DOCUMENTS

| | | | | |
|---|---|---|---|---|
| 4,028,722 | A * | 6/1977 | Helda | H01L 24/01 |
| | | | | 174/533 |
| 9,935,041 | B1 * | 4/2018 | Lopez | H01L 23/49541 |
| 2006/0055011 | A1 * | 3/2006 | Carney | H01L 24/40 |
| | | | | 257/676 |
| 2007/0278664 | A1 * | 12/2007 | Carney | H01L 24/73 |
| | | | | 257/E23.044 |
| 2008/0277772 | A1 * | 11/2008 | Groenhuis | H01L 23/49575 |
| | | | | 257/E23.044 |
| 2016/0336303 | A1 | 11/2016 | Tsai | |
| 2017/0309554 | A1 * | 10/2017 | Mangrum | H01L 21/4825 |
| 2019/0139866 | A1 * | 5/2019 | Kuraya | H01L 24/29 |
| 2019/0295957 | A1 * | 9/2019 | Inumiya | C25D 3/38 |
| 2019/0326204 | A1 * | 10/2019 | Miura | H01L 23/49562 |
| 2020/0273790 | A1 * | 8/2020 | Tay | H01L 23/49861 |

* cited by examiner

300

300

300

300

400

400

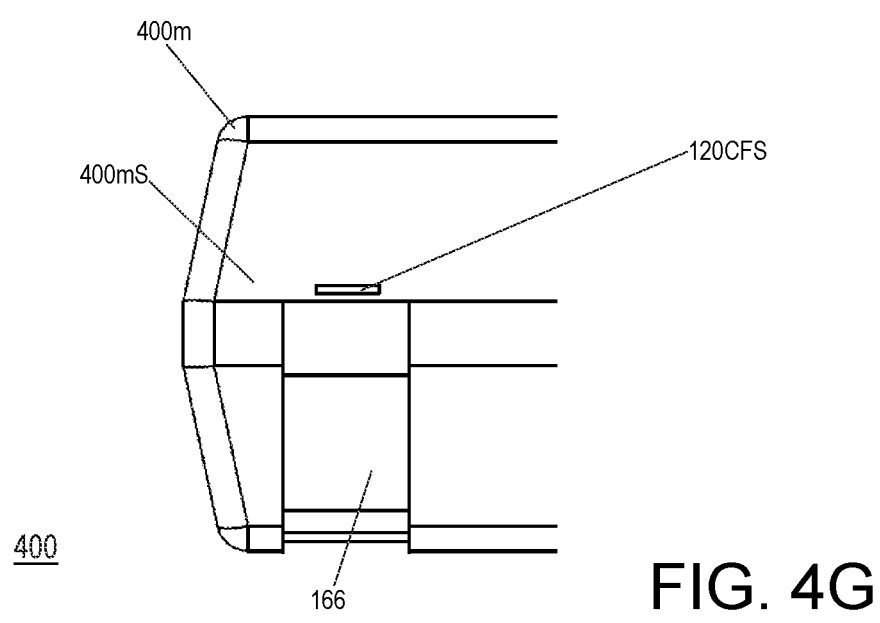

FIG. 4G

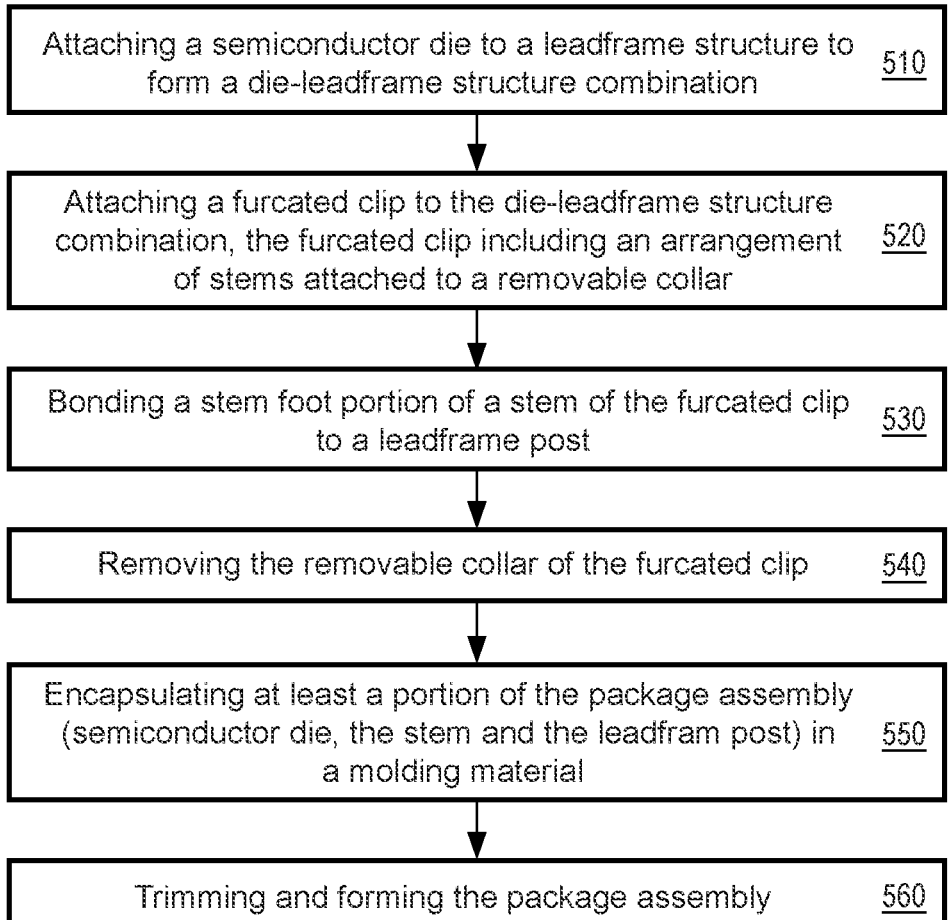

| | |
|---|---|
| Attaching a semiconductor die to a leadframe structure to form a die-leadframe structure combination | 510 |
| Attaching a furcated clip to the die-leadframe structure combination, the furcated clip including an arrangement of stems attached to a removable collar | 520 |
| Bonding a stem foot portion of a stem of the furcated clip to a leadframe post | 530 |
| Removing the removable collar of the furcated clip | 540 |
| Encapsulating at least a portion of the package assembly (semiconductor die, the stem and the leadfram post) in a molding material | 550 |
| Trimming and forming the package assembly | 560 |

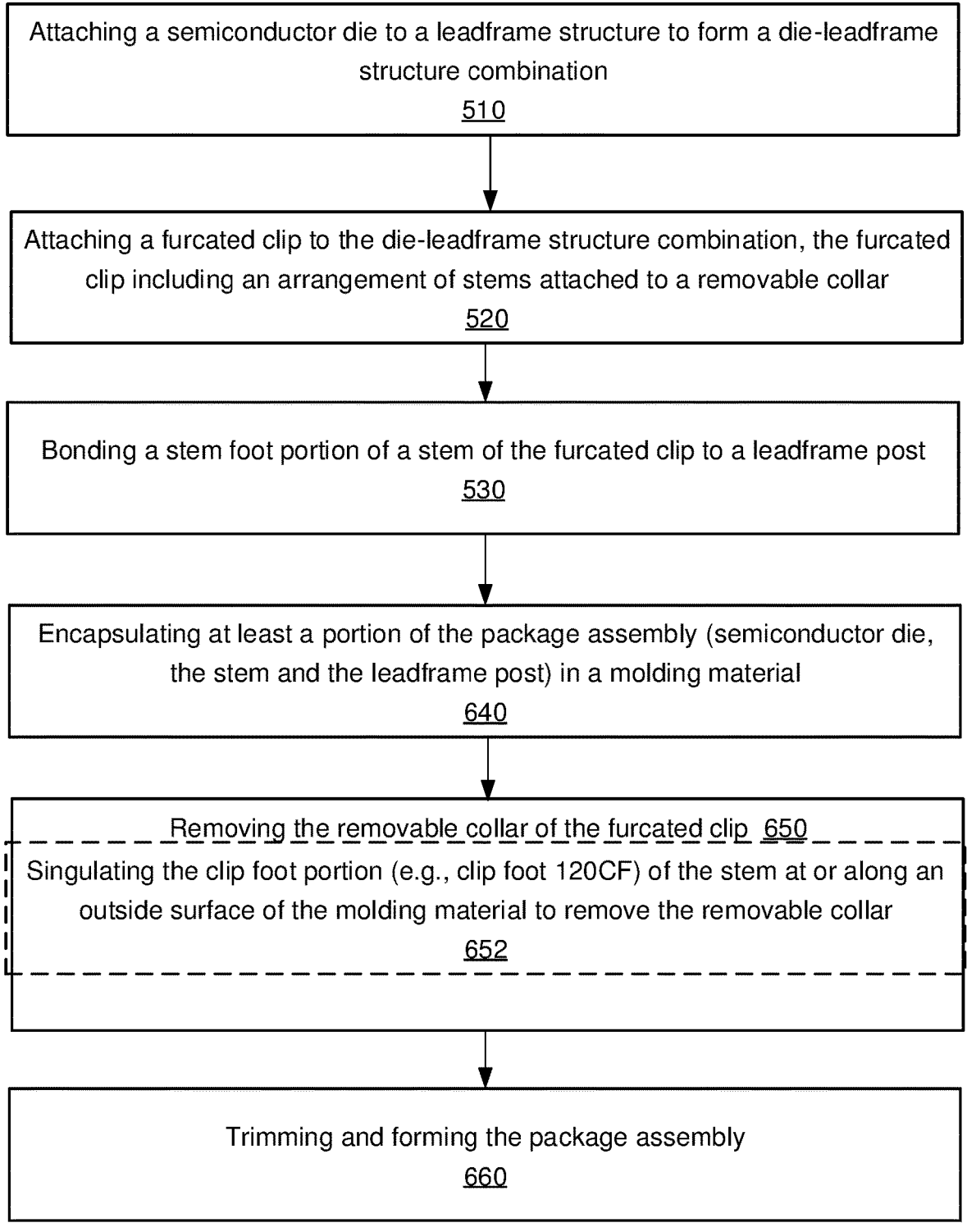

Attaching a semiconductor die to a leadframe structure to form a die-leadframe structure combination
510

Attaching a furcated clip to the die-leadframe structure combination, the furcated clip including an arrangement of stems attached to a removable collar
520

Bonding a stem foot portion of a stem of the furcated clip to a leadframe post
530

Encapsulating at least a portion of the package assembly (semiconductor die, the stem and the leadframe post) in a molding material
640

Removing the removable collar of the furcated clip 650

Singulating the clip foot portion (e.g., clip foot 120CF) of the stem at or along an outside surface of the molding material to remove the removable collar
652

Trimming and forming the package assembly
660

CLIP INTERCONNECT WITH MICRO CONTACT HEADS

TECHNICAL FIELD

This description relates to packaging of semiconductor die.

BACKGROUND

A typical semiconductor device package includes a semiconductor die disposed on a leadframe structure that includes leads providing external electrical connections (external to the package) for individual devices or integrated circuits in the semiconductor die. The semiconductor die typically is mounted on a paddle or flag in the leadframe structure and device contact pads on the semiconductor die are electrically connected to respective ones of the leads.

In many cases, thin bond wires are used to electrically connect the device contact pads on the semiconductor die to the leads. In other cases, efforts have been made to use electrically conductive ribbon or pre-formed clips instead of bond wires within semiconductor device packages, for example, for high power electrical connections to large device contact pads.

A traditional wire-bonded approach to make electrical connections from the device or integrated circuit (IC) to the outside circuit or circuit board is widely used, but requires a high number of source wires—typically made of aluminum, copper or gold to reduce conduction losses or increase power density due to drain-source on resistance, or RDS (on). In clip-bonding technology, a solid copper bridge attached to the die surface replaces multiple bonded wires to reduce the overall package resistance of the product when compared to copper wire. Also, demand for high performance and functionality from devices packaged in packages of ever-smaller form factors presents significant technical challenges.

SUMMARY

A device package includes a semiconductor die and a leadframe structure. The semiconductor die includes at least a bond pad forming an external electrical contact of an electronic device or circuit formed in the semiconductor die. The leadframe structure includes a leadframe post, and at least a lead extending to an outside of the device package. The device package further includes a stem having a needle-like tip and a stem foot portion. The needle-like tip is attached to the bond pad and the stem foot portion is attached to the leadframe post. The stem electrically connects the bond pad to the lead extending to the outside of the device package.

A furcated clip includes a removable collar, and an arrangement of stems attached to the removable collar Each of the stems is configured to contact a bond pad of a semiconductor die and to connect the bond pad to a leadframe post of a leadframe structure.

The details of one or more implementations are set forth in the accompanying drawings and the description below. Other features will be apparent from the description and drawings, and from the claims.

BRIEF DESCRIPTION OF THE DRAWINGS

FIGS. 4E through 4G illustrate another example process for assembly of a device package that deploys a furcated clip to connect an enclosed semiconductor die to leads of a leadframe structure.

FIG. 5 illustrates an example method for assembling a device package.

FIG. 6 illustrates another example method for assembling a device package.

DETAILED DESCRIPTION

Figure 1A:
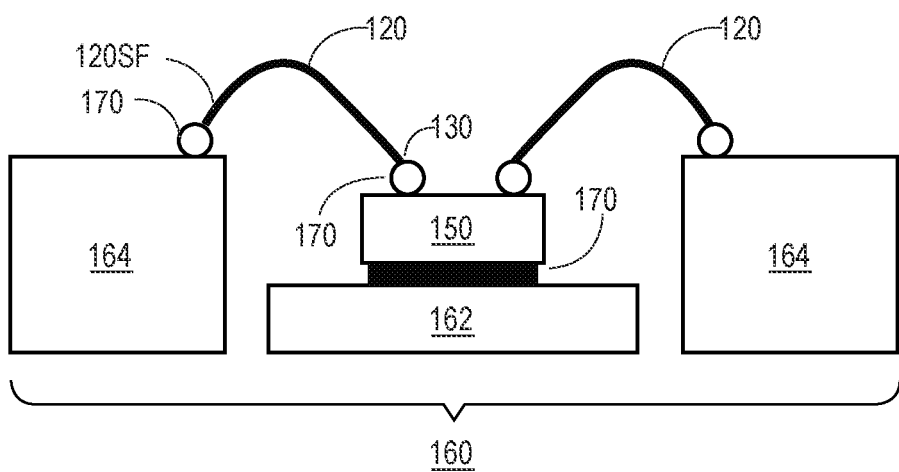
FIG. 1A illustrates an example arrangement in which a semiconductor die is connected to leadframe posts by stems of a furcated clip.

Modern electronic devices (e.g., transistors, diodes, etc.) and circuits are fabricated in semiconductor die that are increasingly miniaturized. Conductive metal or metalized device contacts, which can be referred to as bond pads are disposed on a surface of the semiconductor die in a specific geometrical layout. The bond pads may form the external electrical contacts (e.g., device terminals) of electronic devices and circuit elements within the semiconductor die.

Each bond pad may provide an electrical connection for, for example, a respective specific input/output (I/O) function of the semiconductor die. In example implementations, a semiconductor die (including, e.g., an IGBT device) may have one or more bond pads as external electrical contacts (e.g., emitter contact pads) to an emitter of the device, and several other bond pads (e.g., signal sense contact pads) as external electrical contacts to other terminals (e.g., gate, emitter sense, collector sense, current sense, temperature sense cathode, temperature sense anode, etc.) of the device.

The semiconductor die can be packaged for use in a device module or package. In a typical device package, the semiconductor die may be placed on a substrate or a leadframe structure having leads connecting the semiconductor die (e.g., via the bond pads) to the external environment (e.g., external to the device module or package). The bond pads on the semiconductor die can be coupled (e.g., via bond wires or clips) to corresponding leadframe posts of leads in the leadframe structure. The leads may provide electrical connection from and/or to outside the device package for respective specific I/O functions of the semiconductor die.

Modern semiconductor die can have more functionality (e.g., more devices and circuits) and a correspondingly greater number of bond pads than before. Further, with increasing demands of miniaturization, bond pads on the semiconductor die can have smaller dimensions (e.g., <100 micrometers), and a number of bond pads may be disposed at a smaller pitch (e.g., <100 micrometers) in a layout on the semiconductor die than before. Micro bumping could be potentially considered for bonding the miniaturized bond pads to lead posts/leads. However, micro bumping may not be a workable solution because the smaller pitch of the bond pads may not match a pitch of lead posts/leads (in the leadframe structure) via which the semiconductor die in a package is connected to the external environment. For example, a bond pad pitch on a modern semiconductor die may be less than 100 microns, while a leadframe post pitch can be greater than 150 microns in a leadframe for a device package.

Wire bonding and clips (e.g., copper bridges to large device contact pads) to connect the semiconductor die to the mismatched-pitch lead posts may not be workable solutions for providing electrical connection for respective specific I/O functions of the modern semiconductor die having bond pads of small dimensions (e.g., <100 micrometers).

In some implementations, the bond pads in the semiconductor die can be coupled to corresponding leadframe posts in the leadframe structure using multiple types of interconnections, for example, bond wires and clips. Using multiple types of interconnections (e.g., bond wires and clips) in a single package complicates package assembly by requiring different processes (e.g., processes for clip-attach and wire bonding). Using the different processes in package assembly can require a larger assembly equipment or tool set for implementing the different processes for the multiple types of interconnections in a single package. Further, using the different processes in the package assembly may increase a risk of defects, for example, due to cross-contamination (e.g., bond pads for wire bonding may be exposed to chemicals inherent in a clip-attach process) of the different processes. The cross-contamination may result in defects such as non-stick-on-pad.

The innovations described herein address these newly discovered and unresolved issues in providing electrical connections for respective specific I/O functions of the modern semiconductor die with a large number of bond pads and/or with a small bond pad pitch enclosed in a device module or package.

The innovations described herein also obviate a need for using multiple types of interconnections (e.g., bond wires and clips) in a single package.

In some implementations, a furcated clip with needle-like tips having micro contact tip heads can provide interconnections between bond pads of a semiconductor die and leadframe posts in a device package, in accordance with the principles of the present disclosure.

The furcated clip may be made of metal (e.g., copper, copper alloy, tungsten, tungsten alloy, other metal or metal alloy) and include a removable support collar or ring (removable collar) to which an arrangement of stems including needle-like tips is attached. The arrangement of stems may have three dimensional characteristics (i.e., the stems may extend in three dimensions (x, y and z)). The furcated clip may be a pre-form for a specific arrangement of stems including needle-like tips for contacting a specific layout of bond pads of a specific semiconductor die, and connecting the bond pads to a specific layout of leadframe posts of a leadframe structure. The bond pads may be laid out at a different pitch (e.g., smaller pitch) than a pitch of the leadframe posts (e.g., a larger pitch).

In the furcated clip, the needle-like tips may be attached to stems emanating from the removable collar of the furcated clip. Each stem may include a stem foot portion at one end of the stem, and a needle-like tip at the at other end of the stem.

The needle-like tips may be micro-contact heads configured to contact, and establish electrical connectivity with, the bond pads on the semiconductor die. The needle-like tips may be bonded to the bond pads using, for example, adhesive material (e.g., solder, solder bumps, solder paste, adhesive paste, etc.). The stems of the furcated clip may include respective portions (stem foot portions) adapted to be bonded (e.g., using adhesive material) to respective leadframe posts of the leadframe structure. After the needle-like tips of the stems are bonded to the bond pads and the stem foot portions of the stems are bonded to the leadframe posts to establish an electrical connection between the bond pads of the semiconductor die and the leadframe posts, surplus material portions of furcated clip (e.g., the removable collar, and stem portions between the stem foot portions and the removable collar, etc.) that are not needed for the electrical connections between the bond pads and the leadframe posts may be removed.

FIG. 1A is a cross sectional view of an example arrangement 100 in which a semiconductor die (e.g., semiconductor die 150) is connected to leadframe posts by stems. The stems may be stems of a furcated clip (e.g., furcated clip 200, FIG. 2A).

As shown in FIG. 1A, semiconductor die 150 may be attached (e.g., by adhesive layer 170) to leadframe structure 160. The die may be attached to one or more leadframe posts 164 or to a leadframe flag 162. Adhesive layer 170 may, for example, include solder, solder bumps, solder paste, or adhesive paste, etc. Stems 120 (e.g., of furcated clip 200, FIG. 2A) may interconnect bond pads (not shown) of semiconductor die 150 to leadframe posts 164 of leadframe structure 160. In example implementations, needle tips 130 of the stems may be bonded (e.g., using adhesive layer 170) to the semiconductor die, and stem foot portions 120SF may be bonded (e.g., using adhesive layer 170) to the leadframe posts 164.

Figure 1B:
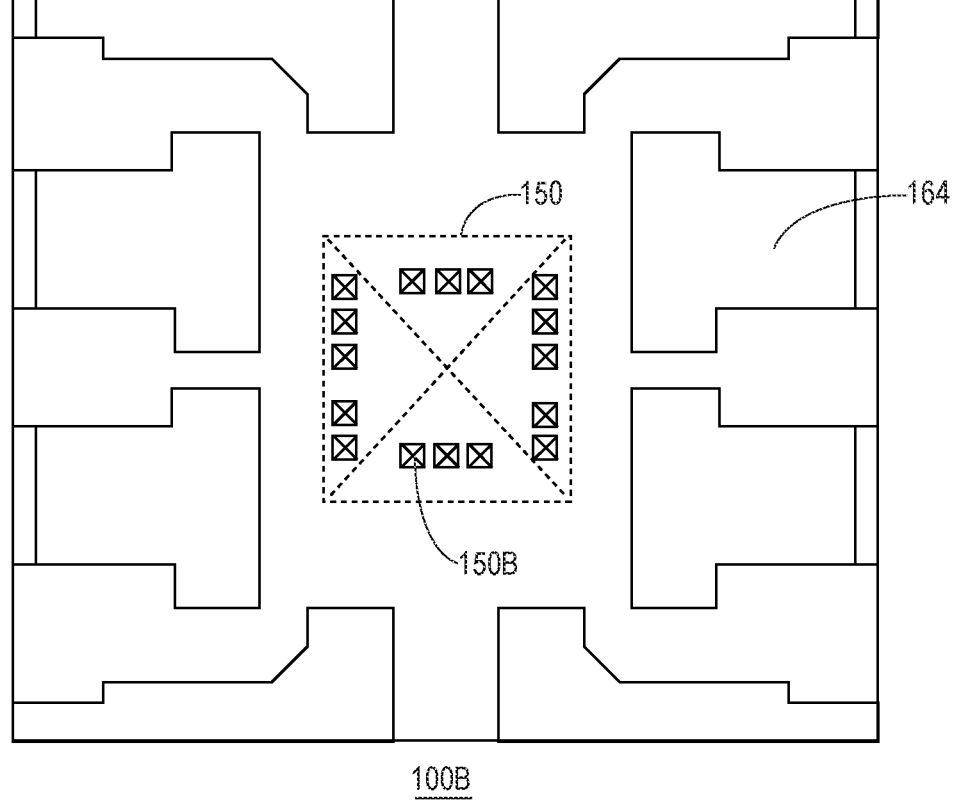
FIG. 1B illustrates an example specific semiconductor die-lead-frame structure combination.

As noted previously the furcated clip may be used to form bond pad-to-leadframe connections in space restricted conditions that are not amenable to wire bonding or conditions in which bond pad pitch and leadframe post pitch is different. FIG. 1B shows an example specific semiconductor die-leadframe structure combination 100B to visually illustrate the relative sizes of a small-size semiconductor die 150 (with small-size bond pads 150B) and the sizes of leadframe posts (leadframe posts 164) in an example scenario in which the furcated clip of the present disclosure may be deployed.

Furcated clip 200 may be incorporated in device packages of any design (e.g., Small outline integrated circuit package (SOIC), Quad-flat no-leads package (QFN), Chip-scale package (CSP), Thin-shrink small-outline package (TS-SOP), etc.).

Figures 2A, 2B:
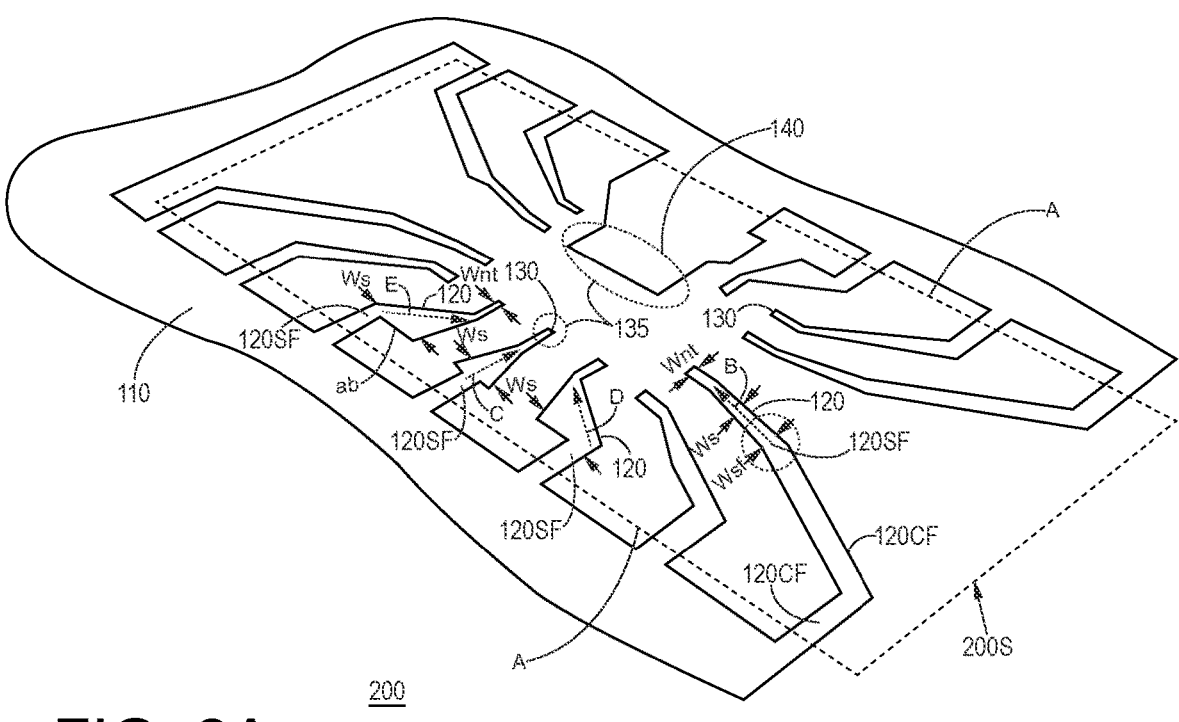
FIG. 2A illustrates an example furcated clip for connecting bond pads of a semiconductor die to leadframe posts of a lead frame structure.
FIG. 2B illustrates an arrangement of stems 120 separated from the furcated clip 200 of FIG. 2A.

FIG. 2A shows an example furcated clip 200 for connecting bond pads of a semiconductor die (e.g., semiconductor die 150) to leadframe posts of a lead frame structure, in accordance with the principle of present disclosure. Furcated clip 200 may include or be a pre-form of an arrangement 200S of stems that is geometrically configured to connect specific bond pads to specific leadframe posts for a specific semiconductor die-leadframe structure combination (e.g., combination 100B, FIG. 1B).

As shown in FIG. 2A, furcated clip 200 may include a removable collar 110. An arrangement 200S (FIG. 2B) of stems 120 is supported by removable collar 110. A first end of each stem 120 in the arrangement may be attached to removable collar 110 via a clip foot portion (e.g., clip foot 120CF) of the stem. A second end of stem 120 may, for example, extend into in a needle tip (e.g., needle tip 130) or a band (e.g., band clip 140). Each needle tip (or band clip) may form a contact head 135 for contacting a bond pad of the semiconductor die (e.g., semiconductor die 150 shown in FIG. 1A). Contact head 135 of a needle tip (e.g., needle tip 130) may be a micro contact head for contacting small bond pads (e.g., bond pads less than 100 microns in size). Contact head 135 of a band clip (e.g., band clip 140) may be a ribbon or band having dimensions that are considerably greater than 100 microns (e.g., 1000 microns or greater). The ribbon or band may be configured to contact, for example, large bond pads (e.g., drain contact pads) on the semiconductor die. Further, each stem 120 may include a stem foot portion (e.g., stem foot 120SF). The stem foot portion (e.g., stem foot 120SF) of each stem 120 may be configured (e.g., adapted) to be bonded to a respective leadframe post of the leadframe structure. Stem foot 120SF may be disposed in stem 120 between clip foot 120CF and needle tip 130 (or band clip 140). Stems with micro contact heads (e.g., needle tip 130) may be referred to herein as needles.

In example implementations, arrangement 200S may be made by from a sheet of metal or metal alloy (e.g., by cutting, stamping, or etching the sheet of metal or metal alloy). Each stem 120 may have a ribbon-like structure. Stem 120 may have a ribbon width Ws, stem foot 120SF in the stem may have a ribbon width Wsf, and needle tip 130 may have a ribbon width Wnt. Ribbon width Wnt of needle tip 130 may be sized to form a micro contact head. Ribbon width Wsf of stem foot 120SF may be sized in consideration of a respective leadframe post (e.g., leadframe post 164, FIG. 4A) to which stem foot 120SF is configured to be bonded.

As shown in FIG. 2A, stems 120 may have different shapes. Each stem 120 may extend from stem foot 120SF to needle tip 130 in a respective direction (e.g., direction B, C, D, or E). Ribbon width Ws of stem 120 may be different from stem to stem giving the stems different shapes.

For example, for the stem in direction B (which may be generally symmetrical about direction B) ribbon width Ws of the stem may taper down from about ribbon width Wsf of stem foot 120SF to about ribbon width Wnt of needle tip 130.

For example, the stem in direction C may have a shape of an arrowhead (which may be generally symmetrical about direction C) with an arrowhead base ab near about stem foot 120SF. The arrowhead/stem may have a ribbon width Ws at about stem foot 120SF that is substantially larger than ribbon width Wsf of the stem foot. Ribbon width Ws of the stem may taper down (i.e., decrease) from the width at arrowhead base ab along direction C to about ribbon width Wnt of needle tip 130.

For example, the stems in direction D and E also may have shapes of an arrowhead (which may be generally asymmetrical about direction D and E, respectively) with an arrowhead base ab near about stem foot 120SF. Like the stem in direction C, the arrowhead/stem may have a ribbon width Ws at about stem foot 120SF that is substantially larger than ribbon width Wsf of the stem foot. The arrowhead shape may be lopsided with respect to direction D and E, respectively. Arrowhead base ab may extend (e.g., orthogonal to direction D, E) more on one side than the other side of direction D, E. For example, arrowhead base ab of the stem in direction D may extend more on the left side that the right side of direction D; and arrowhead base ab of the stem in direction E may extend more on the right side than the left side of direction E.

For both the stems in directions D and E, stem ribbon width Ws of the stem may taper down (i.e., decrease) from the arrowhead base ab along direction D, E to about ribbon width Wnt of needle tip 130.

For example, for the stem in direction B, ribbon width Ws (which may be generally symmetrical about direction B), ribbon width Ws may taper down from ribbon width Wsf of stem foot 120SF to ribbon width Wnt of needle tip 130.

Arrangement 200S of stems 120 may be separated from furcated clip 200 by removing removable collar 110 from the furcated clip 200, for example, by a singulation along clip foots 120CF of the stems (e.g., along the dashed lines A shown in FIG. 2A). FIG. 2B shows for purposes of illustration, arrangement 200S of stems 120 separated from furcated clip 200 after removal of removable collar 110 from furcated clip 200. One or more of stems 120 may be needles with micrometer-sized contact heads. One or several stems may be needles with bulk contact heads.

Figure 3A:
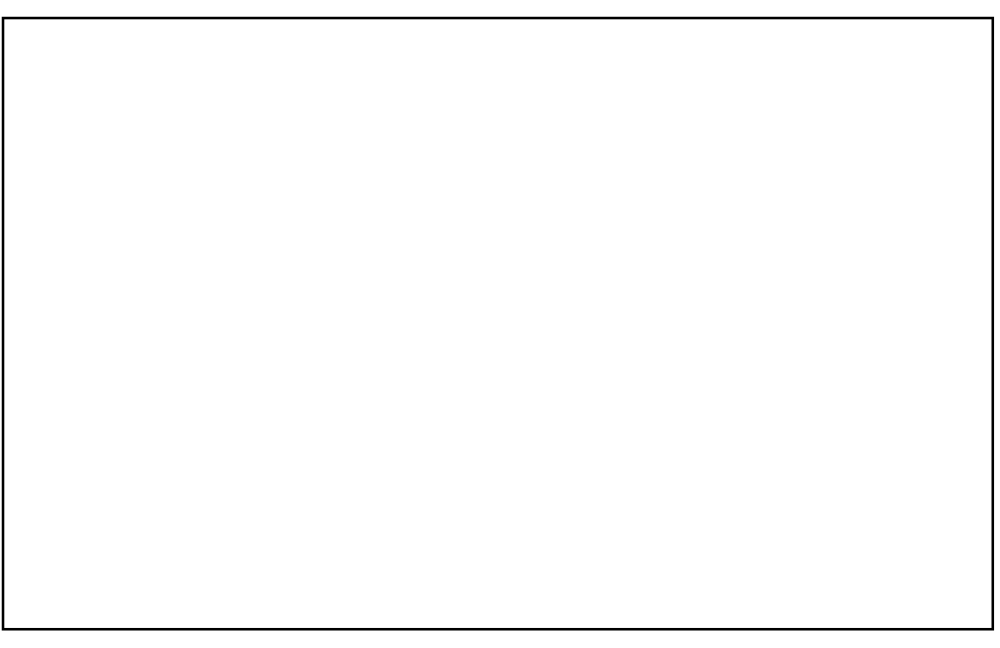
FIGS. 3A and 3B illustrate a sheet of metal which is etched to create arrays of two-dimensional patterned rectangles in the sheet.
Figure 3B:
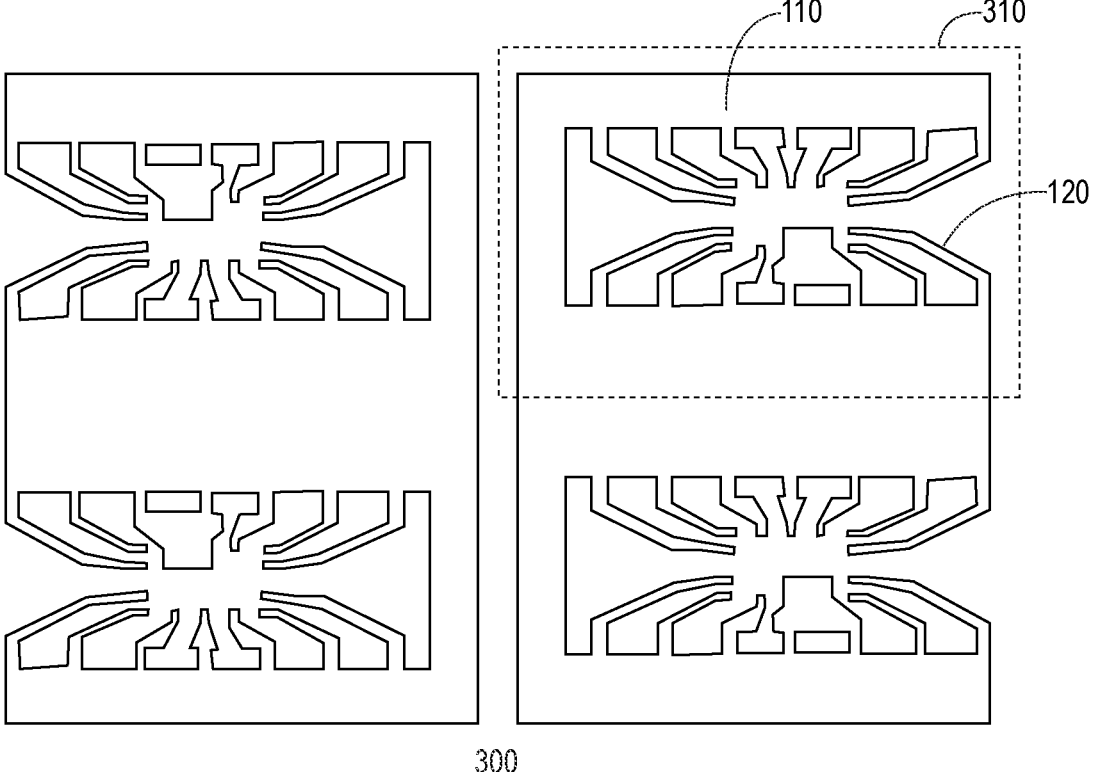

In example implementations, furcated clip 200 may be manufactured by etching or cutting (e.g., laser cutting) patterns in a two-dimensional sheet of metal (e.g. a copper, tungsten, other metal, or metal alloy sheet). FIGS. 3A and 3B show, for example, a sheet of metal (sheet 300) which is etched to create arrays of two-dimensional patterned rectangles 310 in the sheet. Sheet 300 of metal may, for example, be made of copper. Each of the two-dimensional patterned rectangles 310 may correspond to a furcated clip 200. Each of the two-dimensional patterned rectangles 310 may include material to form components (i.e., removable collar 110, stems 120, and band clip 140, etc.) of furcated clip 200.

Figures 3C, 3D:
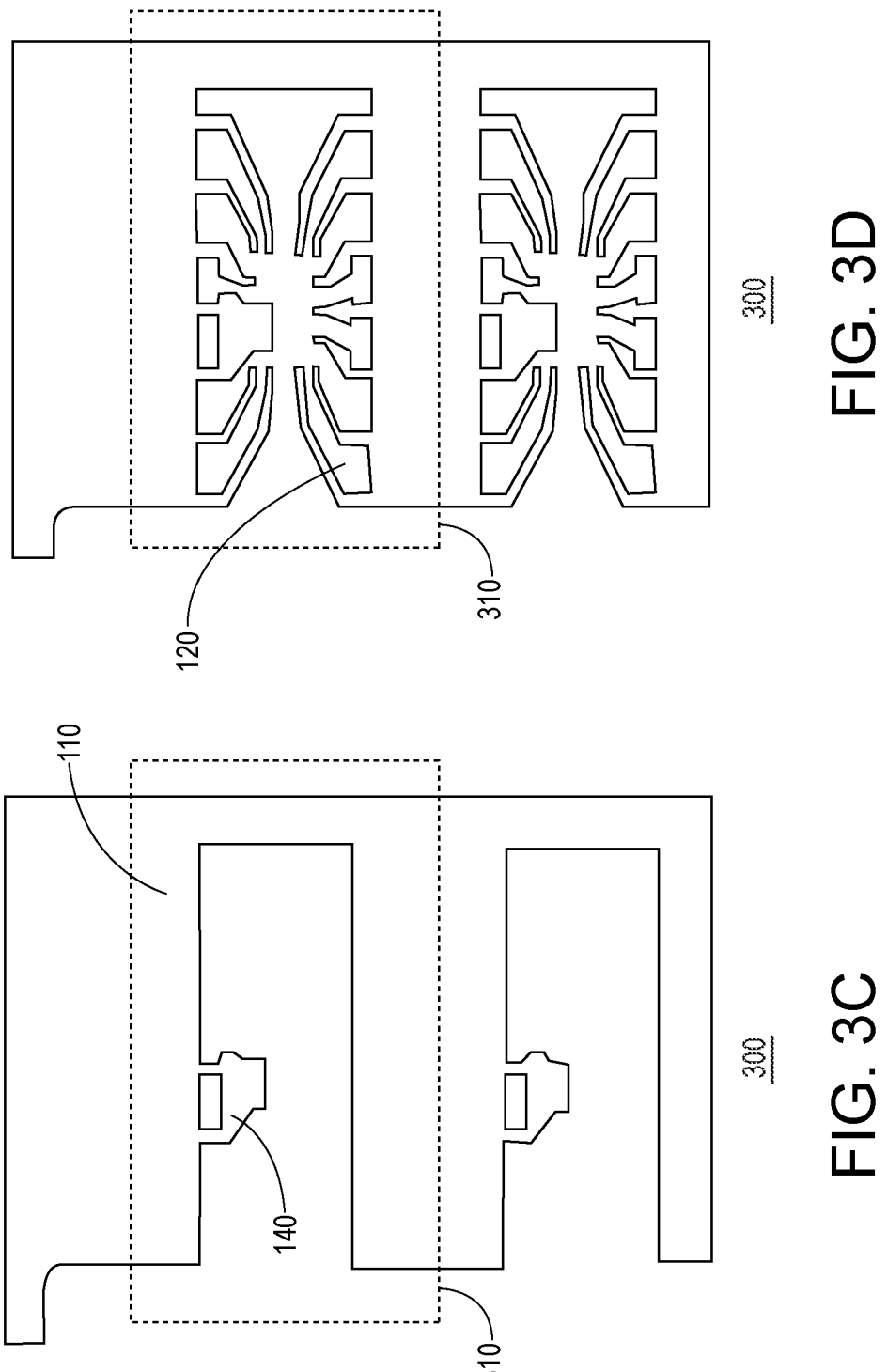
FIGS. 3C and 3D illustrate two-dimensional patterned rectangles etched from the sheet of metal of FIG. 3A.

In another method of manufacturing furcated clip 200, as shown in FIGS. 3C and 3D, the two-dimensional patterned rectangles 310 etched from sheet 300 may initially include only large size components (i.e., removable collar 110 and band clip 140). As shown in FIG. 3D, smaller size components of furcated clip 200 (e.g., stems 120) may be added to the two-dimensional patterned rectangles 310 by welding stems 120 (e.g., by micro welding) to removable collar 110.

In example implementations, all or portions of furcated clip 200 may be manufactured using additive manufacturing (e.g., 3D printing) techniques. For example, smaller size components of furcated clip 200 (e.g., stems 120) may be added to the two-dimensional patterned rectangles 310 by 3D printing.

Further, each of patterned rectangles 310 (with etched stems (FIG. 3B) or welded stems (FIG. 3D)) may be stamped in a press (not shown) to give three-dimensional character to a configuration of the collar (e.g., removable collar 110) and the stems (e.g., stems 120) in the patterned rectangles 310 and produce a three-dimensional furcated clip 200 (FIG. 2A).

FIGS. 4A through 4D illustrate an example process for assembly of a device package (e.g., device package 400) that deploys a furcated clip (e.g., furcated clip 200) to connect an enclosed semiconductor die (e.g., semiconductor die 150) to leads of a leadframe structure (e.g., leadframe structure 160), in accordance with the principles of the present disclosure.

Figure 4A:
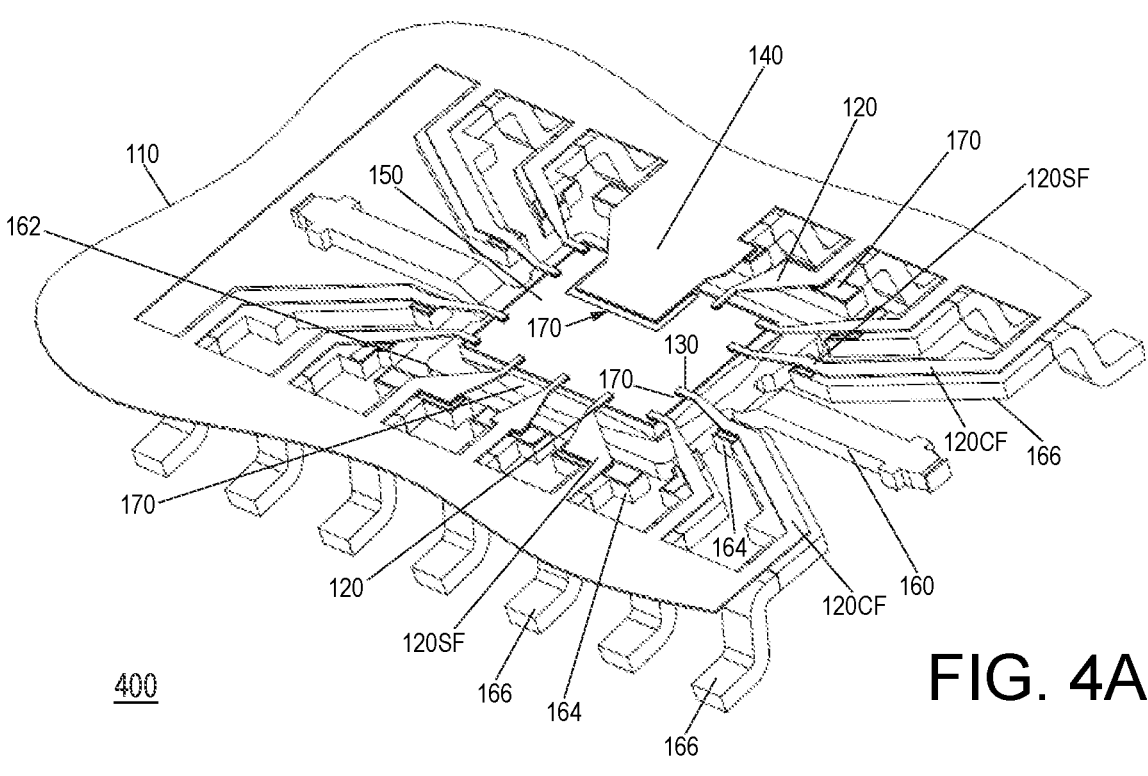
FIGS. 4A through 4D illustrate an example process for assembly of a device package that deploys a furcated clip to connect an enclosed semiconductor die to leads of a leadframe structure.

As shown in FIG. 4A, leadframe structure 160 may include a plurality of leads 166 and associated leadframe posts 164. At an initial stage of the process, a semiconductor die-leadframe structure combination is formed. For example, semiconductor die 150 may be placed on, and bonded to, for example, a leadframe paddle or leadframe flag 162 in leadframe structure 160. An adhesive layer 170 (e.g., a solder bump, a preform solder, a solder paste, an adhesive paste, a sintering or a fusion bond, etc.) may be used to bond the semiconductor die to the leadframe flag and form the semiconductor die-leadframe structure combination.

At a first stage of the process for assembly of the device package, as shown in FIG. 4A, furcated clip 200 may be mechanically attached to (i.e., placed over) the semiconductor die-leadframe structure combination so that needle tips 130 (and band clip 140) are in contact with bond pads (e.g., bond pads 150B, FIG. 1B) on the semiconductor die, and stem foot portions (e.g., stem foot 120SF) of stems 120 are in contact with leadframe posts 164. Clip foot portions of stems 120 (by which stems 120 are attached to removable collar 110) may, for example, geometrically conform to and follow the shape of leads 166 below leadframe posts 164.

Needle tips 130 (and band clip 140) may be bonded to the bonding pads on the semiconductor die by adhesive layer 170. Similarly, stem foot portions (e.g., stem foot 120SF) of stems 120 may be bonded to leadframe posts 164 by adhesive layer 170. Thus, bond pads on semiconductor die 150 may be electrically connected to respective leads 166 via leadframe posts 164. At this stage of the process, as shown in FIG. 4A, a plurality of leads 166 (e.g., all leads shown) are interconnected (i.e., the bond pads connections to respective leads 166 are shorted) by removable collar 110.

Figure 4B:
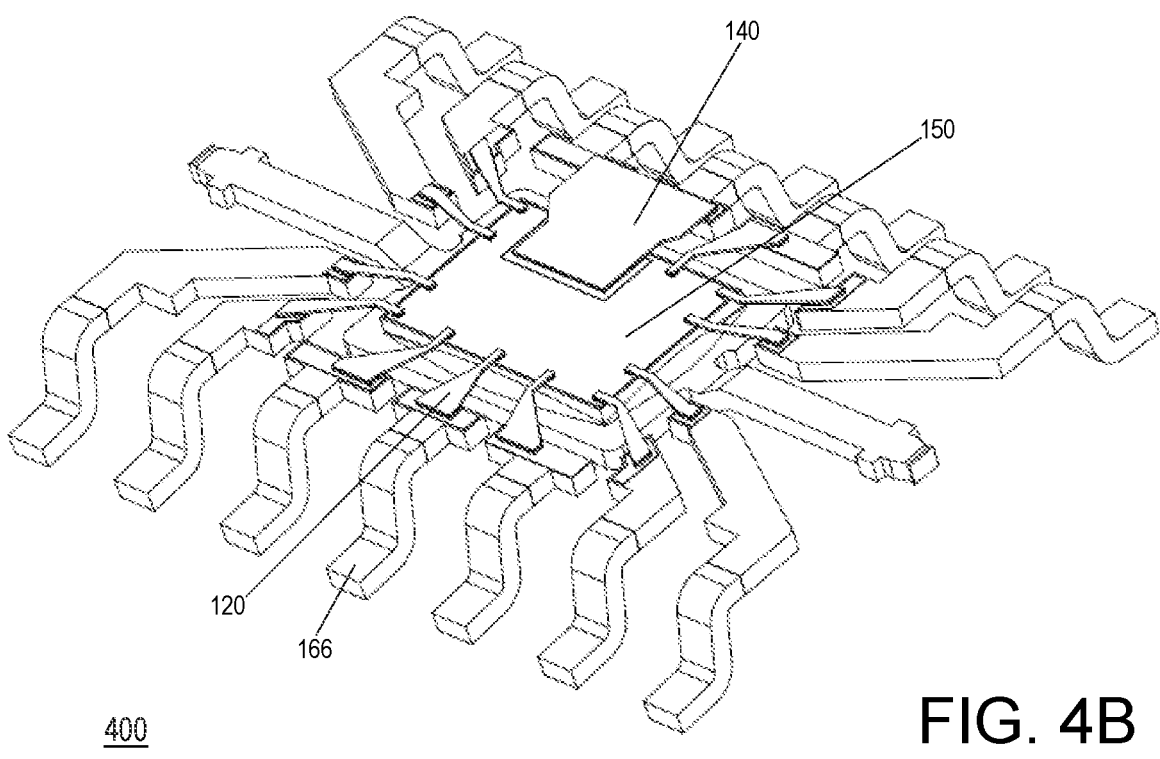

At a next stage of the process for assembly of the device package, removable collar 110 is removed so that each bond pad connection made by a respective stem 120 to respective lead 166 is isolated and is no longer shorted to another lead 166. In example implementations, as shown in FIG. 4B, removable collar 110 may be removed by singulating the clip foot portion (e.g., clip foot 120CF) of each stem 120. The clip foot portion of a stem may be singulated (e.g., by laser cutting or mechanical cutting (e.g., snipping or sawing)) at about (e.g., below or after) leadframe post 164 to which stem foot portion 120SF of stem 120 is bonded.

Figure 4C:
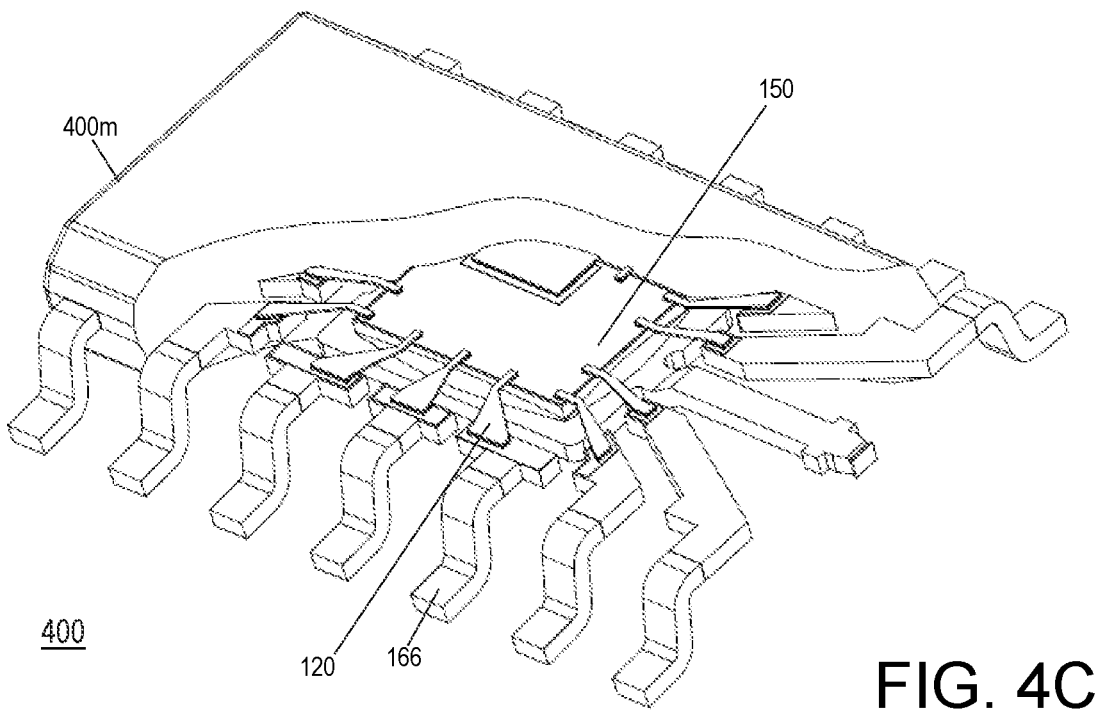

At a further stage of the process for assembly of the device package, the package assembly of FIG. 4B may be encapsulated (e.g., encapsulated at least partially) in a molding material 400m. FIG. 4C shows a cutaway view of the package assembly after encapsulation in the molding material. Further, a trim and form process may be used to complete assembly of device package 400, as shown in FIG. 4D.

In the foregoing process for assembly of the device package described with reference to FIGS. 4A-4D, before encapsulating the package assembly in molding material 400m (FIG. 4C), removable collar 110 is removed by singulating clip foot 120CF of each stem 120 at about leadframe post 164 (FIG. 4B). In another process for assembly of device package 400, as shown in FIGS. 4E and 4F, the package assembly of FIG. 4A may be first encapsulated in molding material 400m before singulating clip foot 120CF of each stem 120 to remove removable collar 110. As shown in a cutaway view in FIG. 4F, after the encapsulation, clip foot 120CF of each stem 120 may be singulated (e.g., by mechanical sawing) at an outside surface (e.g., surface 400 mS) of molding material 400m to remove removable collar 110. This singulation may leave a remaining portion of sawn clip foot 120CF inside molding material 400m. Further, as shown in FIG. 4G, a sawn edge 120CFS of sawn clip foot 120CF may remain visible on surface 400 mS of the molding material.

Figure 4D:
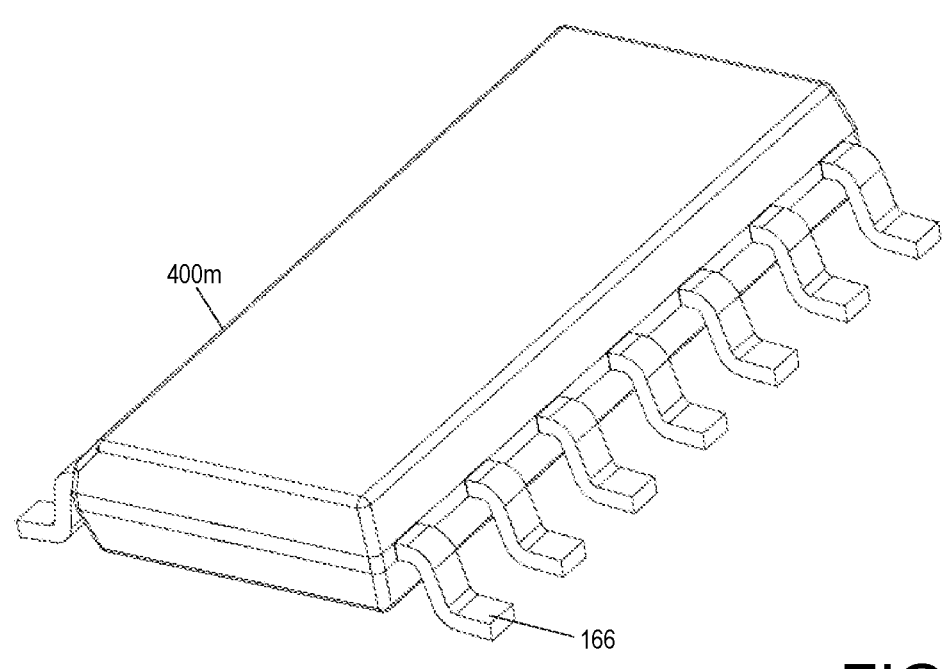
Figure 4E:
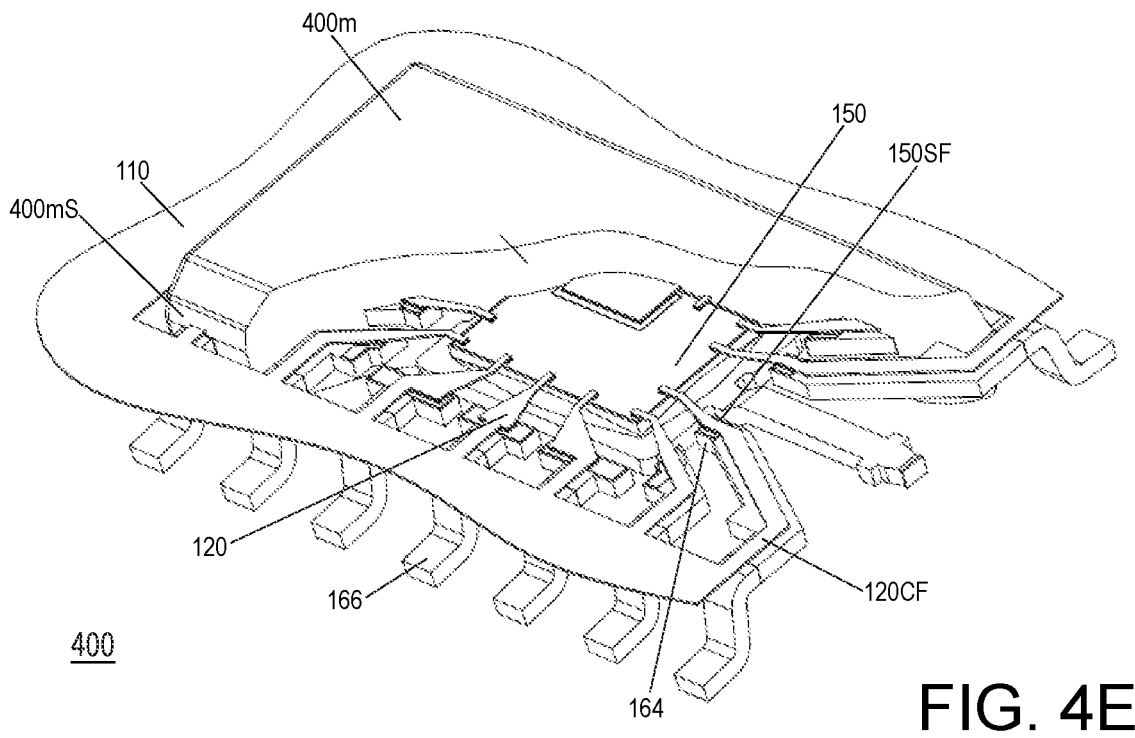
Figure 4F:
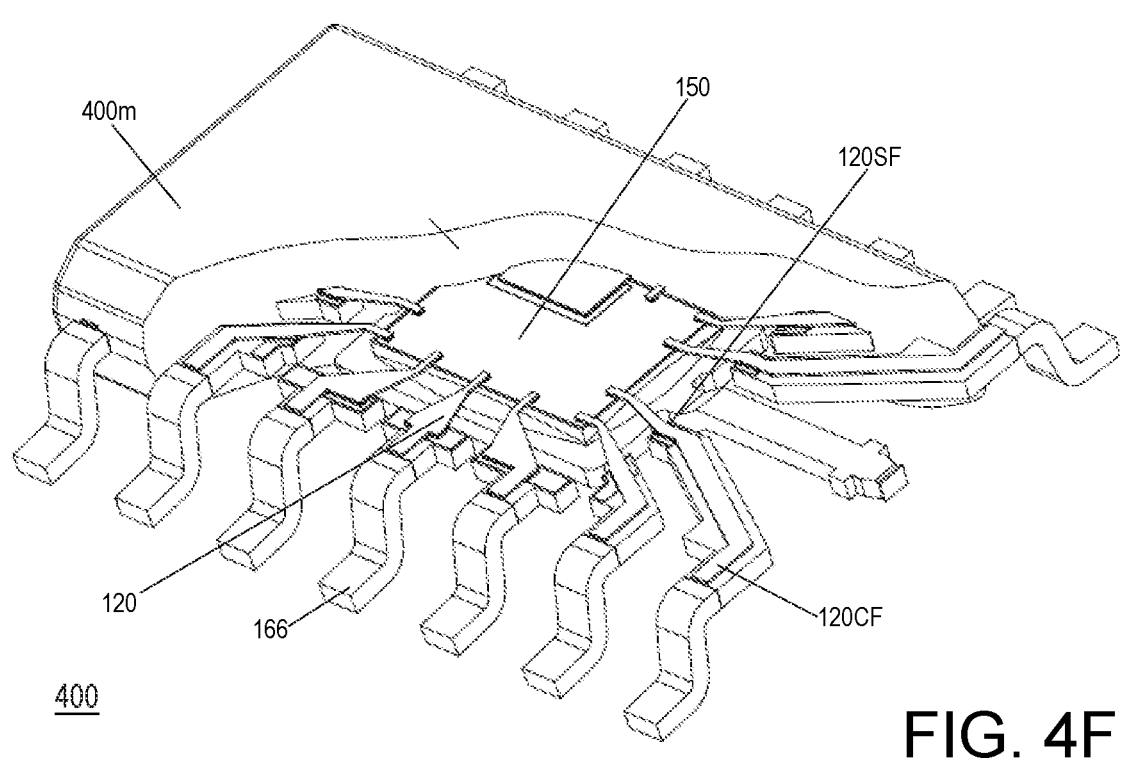

After removing removable collar 110 by singulating the clip foots, a trim and form process may be used to complete assembly of the device package 400 (FIG. 4D).

FIG. 5 illustrates an example method 500 for assembling a device package (e.g., device package 400), in accordance with the principles of the present disclosure.

Method 500 includes attaching a semiconductor die to a leadframe structure to form a die-leadframe structure combination (510), and attaching a furcated clip to the die-leadframe structure combination (520). The furcated clip may include an arrangement of stems attached to a removable collar.

In example implementations, attaching the semiconductor die to a leadframe structure to form the die-leadframe structure combination 510 may include disposing the semiconductor fie on a leadframe flag and using an adhesive material (e.g., solder, solder bumps, solder paste, or adhesive paste) to bond the die to the leadframe structure.

In example implementations, attaching the semiconductor die to a leadframe structure to form the die-leadframe structure combination 510 may include disposing the semiconductor die on one or more leadframe posts and using an adhesive material (e.g., solder, solder bumps, solder paste, or adhesive paste) to bond the die to the one or more leadframe posts.

Attaching the furcated clip to the die-leadframe structure combination 520 may include attaching a furcated clip having a removable collar. An arrangement of stems (needles) (e.g., stems 120) may be attached to the removable collar. Each stem may be attached to the removable collar via a clip foot portion of the stem. Each stem may have a needle-like tip configured to contact, and establish electrical connectivity with, a bond pad on the semiconductor die. The needle-like tip may be a micro contact head or a bulk clip. Each stem may also include a stem foot portion (e.g., stem foot 120SF) adapted to be bonded to a respective leadframe post in the leadframe structure.

In example implementations, attaching the furcated clip to the die-leadframe structure combination 520 may include bonding a needle-like tip of a stem (e.g., stem 120) to the semiconductor die (e.g., to a bond pad on the semiconductor die). An adhesive material may be used for bonding. Further, attaching or coupling the furcated clip to the die-leadframe structure combination 520 may include bonding a stem foot portion of a stem of the furcated clip to a leadframe post (530). An adhesive material may be used for bonding. Bonding the stem foot portion of the stem to the leadframe post may include establishing an electrical connection from a respective bond pad on the semiconductor die to a respective lead attached to the leadframe post via the stem.

After bonding the stem foot portion of the stem to the leadframe post, method 500 may include removing the removable collar of the furcated clip (540).

Removing the removable collar 540 may include isolating the electrical connection from the respective bond pad on the semiconductor die to the respective lead via the stem from other electrical connections between the semiconductor die and other leads (via other stems).

In example implementations, removing the collar 540 may include singulating a clip foot portion (e.g., clip foot 120CF) of the stem. The clip foot portion of a stem may be singulated (e.g., by laser cutting or mechanical cutting (e.g., snipping or sawing)) at about (e.g., below or after) the leadframe post to which stem foot portion of the stem is bonded.

Method 500 may further include, after removing the removable collar, encapsulating at least a portion of the package assembly (semiconductor die, the stem and the leadframe post) in a molding material (550).

In other example implementations of method 500, removing the collar 540 may include first encapsulating the package assembly in a molding material and then singulating the clip foot portion (e.g., clip foot 120CF) of the stem. The clip foot portion of the stem may be singulated by mechanical cutting (e.g., snipping or sawing)) at or along an outside surface of the molding material to remove the removable collar.

Method 500 may further include, after removing the removable collar, trimming and forming the molded package assembly (560). The trimming and forming (e.g., vacuum forming) may remove burrs and excess material to produce a finished molded device package (e.g., device package 400, FIG. 4D).

FIG. 6 illustrates another example method 600 for assembling a device package (e.g., device package 400), in accordance with the principles of the present disclosure.

Method 600, like method 500, includes attaching a semiconductor die to a leadframe structure to form a die-leadframe structure combination (510), and attaching a furcated clip to the die-leadframe structure combination (520). The furcated clip may include an arrangement of stems attached to a removable collar. Attaching the furcated clip to the die-leadframe structure combination 520 may include bonding a needle-like tip of a stem (e.g., stem 120) to the semiconductor die (e.g., to a bond pad on the semiconductor die), and bonding a stem foot portion of a stem of the furcated clip to a leadframe post (530).

After bonding the stem foot portion of the stem to the leadframe post, method 600 may include encapsulating at least a portion of the package assembly (semiconductor die, the stem and the leadframe post) in a molding material (640), and then removing the removable collar of the furcated clip (650).

Removing the removable collar 650 may include isolating the electrical connection from the respective bond pad on the semiconductor die to the respective lead via the stem from other electrical connections between the semiconductor die and other leads (via other stems).

In example implementations, removing the collar 650 may include singulating the clip foot portion (e.g., clip foot 120CF) of the stem. at or along an outside surface of the molding material to remove the removable collar (652). The clip foot portion of the stem may be singulated by mechanical cutting (e.g., snipping or sawing)) at or along an outside surface of the molding material to remove the removable collar.

Method 600 may further include, after removing the removable collar, trimming and forming the molded package assembly (660). The trimming and forming (e.g., vacuum forming) may remove burrs and excess material to produce a finished molded device package (e.g., device package 400, FIGS. 4D and 4E).

As noted previously, furcated clip 200 may be incorporated in device packages of any design (e.g., Small outline integrated circuit package (SOIC), Quad-flat no-leads package (QFN), Chip-scale package (CSP), Thin-shrink small-outline package (TSSOP), etc.). For example, device package 400 may include a design and dimensions of one of: a small outline integrated circuit package (SOIC), a quad-flat no-leads package (QFN), a chip-scale package (CSP) and a thin-shrink small-outline package (TSSOP).

In the examples discussed in the foregoing, the semiconductor die in the package is attached to a paddle or flag of the leadframe structure (e.g., leadframe flag 162). Furcated clip 200 also may be used in package designs with leadframe structures that do not include a leadframe flag, are chip-on-lead structures, or pre-molded leadframe structures.

In an example device package with a chip-on-lead design or a pre-molded leadframe structure, furcated clip 200 (including arrangement 200S of stems 120, FIG. 2B) may be first attached to the pre-molded leadframe structure, and then the semiconductor die may be attached to stems 120 of furcated clip 200 (attached to the pre-molded leadframe structure). The semiconductor die may be attached to stems 120 in a flip-chip configuration using, for example, solder bumps. The package assembly may be then encapsulated in molding material. Clip foot portions 120CF of the stems 120 may be singulated before or after the molding to remove removable collar 110 of the furcated clip 200 and to thus isolate the individual electrical connections made by stems 120 to individual leads of the leadframe from one another.

It will be understood that, in the foregoing description, when an element, such as a layer, a region, a substrate, or component is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application, if any, may be amended to recite exemplary relationships described in the specification or shown in the figures.

As used in the specification and claims, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Some implementations may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Gallium Nitride (GaN), Silicon Carbide (SiC) and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. A device, comprising:

a body of molding material that encapsulates a semiconductor die, a portion of a leadframe structure and a portion of a furcated clip, the furcated clip including an arrangement of stems and a collar;

at least one stem of the arrangement of stems comprising a first portion and a second portion, the first portion attaching the second portion to the collar, the second portion including a base bonded to the leadframe structure and a needle tip bonded to the semiconductor die, the base including a base edge aligned in a first direction parallel to the collar;

the second portion including a first side surface and a second side surface, the first side surface and the second side surface each extending from the base edge to the needle tip;

wherein the second portion decreases in width from the base edge to the needle tip, the width at the needle tip being smaller than the width at the base edge, the width being measured in the first direction from the first side surface of the second portion to the second side surface of the second portion;

the first portion including a first end attached to the collar, a second end attached to the base edge of the second portion, the second end of the first portion having a width smaller than the width of the second portion at the base edge; and the first portion including a first side surface and a second side surface, each of the first side surface of the first portion and the second side surface of the first portion extending between the first end and the second end of the first portion; and the collar is located outside of the body of molding material and each stem of the at least one stem extends from the collar and into the body of molding material to the semiconductor die with the first side surface and the second side surface of the first portion extending from outside of the molding material to inside of the molding material.

2. The device of claim 1, wherein the at least one stem is made of a ribbon-like metal or metal alloy structure and the second portion is bonded to a leadframe post of the leadframe structure.

3. The device of claim 1, wherein the needle tip includes a micro-contact head bonded and electrically connected to a metallic bond pad on the semiconductor die.

4. The device of claim 1, wherein the collar and the arrangement of stems are made of metal or a metal alloy.

5. The device of claim 1, wherein the arrangement of stems extends in three dimensions.

6. The device of claim 1, wherein the collar is a ring-shaped structure.

7. The device of claim 1, wherein the collar is a rectangular ring-shaped structure.

8. The device of claim 1, wherein the second portion of the at least one stem is symmetric.

9. The device of claim 1, wherein the collar is configured to be removed by singulating the first portion of each stem of the at least one stem.

10. The device of claim 1, wherein the needle tip is disposed at a distal end of the at least one stem, the needle tip having a micrometer-sized contact head bonded to a first bond pad of the semiconductor die; and the arrangement of stems includes at least another stem having a band clip tip bonded to a second bond pad of the semiconductor die.

11. The device of claim 10, wherein the band clip tip has a larger contact area than a contact area of the micrometer-sized contact head of the needle tip.

12. The device of claim 11, wherein the band clip tip has a width greater than 1000 μm.

13. A device comprising:

a semiconductor die;

a leadframe structure;

a furcated clip including a first stem, a second stem, and a collar;

a body of molding material that encapsulates the semiconductor die, a portion of the leadframe structure and a portion of the furcated clip;

the first stem including a first portion, a second portion, and a needle tip, the first portion attaching the second portion to the collar the second portion extending from the first portion to the needle tip;

the second portion including a base that is bonded to a first leadframe post of the leadframe structure, wherein the second portion decreases in width from the base to the needle tip, the width measured in a first direction parallel to the collar from a first side surface of the second portion to a second side surface of the second portion;

the first portion including a first side surface and a second side surface, each of the first side surface of the first portion and the second side surface of the first portion extending between the collar and the base of the second portion, the first portion having a width measured in the first direction from the first side surface of the first portion to the second side surface of the first portion;

wherein the width of the second portion at the base is larger than the width of the first portion;

wherein the needle tip includes a micro contact head bonded to a first bond pad on the semiconductor die; and the second stem including a band clip tip bonded to a second bond pad on the semiconductor die, the band clip tip having a width greater than a width of the needle tip; and the collar is located outside of the body of molding material and the first stem extends from the collar and into the body of molding material to the semiconductor die with the first portion extending from outside of the molding material to inside of the molding material.

14. The device of claim 13, wherein the first stem is made of a ribbon-like metal, or metal alloy structure.

15. The device of claim 13, wherein the needle tip is bonded to the first bond pad and the base of the second portion is bonded to the first leadframe post by at least one of: a solder bump, a preform solder, a solder paste, an adhesive paste, a sintering bond, or a fusion bond.

16. The device of claim 13, wherein the needle tip includes a micrometer-sized contact head that is smaller than 100 microns in size.

17. The device of claim 13, wherein the width of the band clip tip is greater than 1000 microns in size.

18. The device of claim 13, wherein the first portion of the first stem is directly attached to the collar.

* * * * *